(12) United States Patent
Song et al.

(10) Patent No.: US 8,687,447 B2
(45) Date of Patent: Apr. 1, 2014

(54) SEMICONDUCTOR MEMORY APPARATUS AND TEST METHOD USING THE SAME

(75) Inventors: Choung Ki Song, Ichon-si (KR); Young Do Hur, Ichon-si (KR); Sang Sic Yoon, Ichon-si (KR); Yong Gu Kang, Ichon-si (KR); Gyung Tae Kim, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 615 days.

(21) Appl. No.: 12/650,491

(22) Filed: Dec. 30, 2009

(65) Prior Publication Data

US 2011/0075498 A1 Mar. 31, 2011

(30) Foreign Application Priority Data

Sep. 30, 2009 (KR) .................. 10-2009-0093610

(51) Int. Cl.
*G11C 7/00* (2006.01)
*G11C 29/00* (2006.01)

(52) U.S. Cl.
USPC ...... 365/201; 365/207; 365/203; 365/189.09; 365/189.11

(58) Field of Classification Search
USPC ................. 365/201, 207, 203, 189.09, 189.11
See application file for complete search history.

(56) References Cited

U.S. PATENT DOCUMENTS

| | | | |
|---|---|---|---|
| 5,263,031 A | 11/1993 | Inoue | |
| 5,687,180 A | 11/1997 | Kawasaki | |
| 6,853,593 B1 | 2/2005 | Bae | |
| 6,894,942 B2 * | 5/2005 | Cho | 365/222 |
| 7,095,668 B2 * | 8/2006 | Cho | 365/207 |
| 7,184,342 B2 * | 2/2007 | Seo | 365/203 |
| 7,813,200 B2 * | 10/2010 | Seo | 365/205 |
| 2005/0013175 A1 | 1/2005 | Bae | |
| 2008/0056040 A1 * | 3/2008 | Im et al. | 365/207 |
| 2008/0151674 A1 * | 6/2008 | Ohata et al. | 365/227 |
| 2008/0159028 A1 * | 7/2008 | Choi | 365/201 |

FOREIGN PATENT DOCUMENTS

| | | |
|---|---|---|
| JP | 09-106698 | 4/1997 |
| JP | 10-302467 | 11/1998 |
| JP | 10-340583 | 12/1998 |
| JP | 2002-074960 | 3/2002 |
| JP | 2005-071582 | 3/2005 |
| KR | 1020070003049 A | 1/2007 |
| KR | 10-0890043 | 3/2009 |

* cited by examiner

*Primary Examiner* — Kretelia Graham
(74) *Attorney, Agent, or Firm* — William Park & Associates Patent Ltd.

(57) ABSTRACT

A semiconductor memory apparatus includes: a precharge voltage control unit configured to selectively output a bit line precharge voltage or a core voltage as a control voltage in response to a test signal; a bit line equalization unit configured to precharge a bit line to the control voltage; a sense amplifier driving control unit configured to generate a first voltage supply control signal, a second voltage supply control signal and a third voltage supply control signal in response to the test signal, a sense amplifier enable test signal, a first voltage supply signal, a second voltage supply signal and a third voltage supply signal; and a voltage supply unit configured to provide the core voltage, an external voltage and a ground voltage to a sense amplifier with an open bit line structure in response to the first to third voltage supply control signals.

18 Claims, 3 Drawing Sheets

SEMICONDUCTOR MEMORY APPARATUS AND TEST METHOD USING THE SAME

CROSS-REFERENCE TO RELATED APPLICATION

The present application claims priority under 35 U.S.C. §119(a) to Korean Application No. 10-2009-0093610, filed on Sep. 30, 2009, which is incorporated by reference in its entirety as if set forth in full.

BACKGROUND OF THE INVENTION

1. Technical Field

Various embodiments of the present disclosure generally relate to a semiconductor integrated circuit, and more particularly, to a semiconductor memory apparatus and a test method using the same.

2. Related Art

FIG. 1 is a diagram schematically showing a configuration of a typical semiconductor memory apparatus with an open bit line structure. As shown in FIG. 1, the typical semiconductor memory apparatus with the open bit line structure comprises a first memory cell 10, a second memory cell 20, a bit line equalization unit 30, a sense amplifier 40, a voltage supply unit 50, and a data transfer unit 60.

The first memory cell 10 comprises a first transistor N1 and a first capacitor C1. When a first word line WL1 is enabled, the semiconductor memory apparatus may store data in the first memory cell 10 by charging/discharging electric charges to/from the first capacitor C1 through a first bit line BL1.

Similarly, the second memory cell 20 comprises a second transistor N2 and a second capacitor C2. When a second word line WL2 is enabled, the semiconductor memory apparatus may store data in the second memory cell 20 by charging/discharging electric charges to/from the second capacitor C2 through a second bit line BL2.

The bit line equalization unit 30 comprises third to fifth transistors N3 to N5. The bit line equalization unit 30 precharges the first and second bit lines BL1 and BL2 to a bit line precharge voltage (VBLP) level if a bit line equalization signal BLEQ is enabled.

The sense amplifier 40 comprises sixth to ninth transistors P1, P2, N6 and N7. The sense amplifier 40 receives a voltage of a first node A_node and a voltage of a second node B_node, and senses and amplifies a voltage level difference between the first and second bit lines BL1 and BL2.

The voltage supply unit 50 comprises tenth to fifteenth transistors N8 to N13. The voltage supply unit 50 applies a core voltage Vcore or an external voltage VDD to the first node A_node in response to first and second voltage supply signals SAP1 and SAP2, and applies a ground voltage VSS to the second node B_node in response to a third voltage supply signal SAN. In addition, the voltage supply unit 50 precharges the first and second nodes A_node and B_node to the bit line precharge voltage (VBLP) level if the bit line equalization signal BLEQ is enabled.

The data transfer unit 60 comprises sixteenth and seventeenth transistors N14 and N15. The data transfer unit 60 transfers data of the first and second bit lines BL1 and BL2 to first and second data transfer lines LIO and LIOB when a column selection signal YS is enabled.

To improve reliability of the semiconductor memory apparatus, a test is typically performed to determine whether or not leakage current has occurred between a word line and a bit line. This test is referred to as an Unlimited Sensing Delay (USD) test, in which the occurrence of leakage current between the word line and the bit line serves as a criterion on how long data stored in the memory cell will be retained.

In the USD test, the semiconductor memory apparatus stores a logic low data in the memory cell, and then enables the word line for a predetermined time. When the predetermined time elapses, the semiconductor memory apparatus performs a read operation to output the stored data. When leakage current has occurred between the word line and the bit line, a logic high data is output, whereas, when no leakage current has occurred, a logic low data is output. The longer the test time between when the word line is enabled and when the read operation is conducted, the higher is the reliability of the USD test.

However, the typical semiconductor memory apparatus with the open bit line structure cannot increase a test time of the USD test due to leakage current of a transistor. This is because in the USD test, since only the first word line WL1 is enabled and the first to third power supply signals SAP1, SAP2 and SAN are all disabled, both the first and second nodes A_node and B_node change to a floating state.

Leakage current of the twelfth transistor N10, which is configured to apply the ground voltage VSS to the second node B_node, is greater than a sum of leakage current of the tenth and eleventh transistors N8 and N9, which are respectively configured to apply the external voltage VDD and the core voltage Vcore to the first node A_node. That is, the amount of leakage current flowing out from the sense amplifier 40 is greater than the amount of leakage current flowing into the sense amplifier 40. In addition, the eighth and ninth transistors N6 and N7, which are respectively coupled to the first and second bit lines BL1 and BL2, also generate leakage current to the second node B_node.

When, in the USD test, the semiconductor memory apparatus enables the first word line WL1 and generates a voltage level difference between the first and second bit lines BL1 and BL2, the voltage levels of the first and second bit lines BL1 and BL2 are continuously decreased as the USD test time is increased.

Consequently, as the USD test time is increased, the voltage level difference between the first and second bit lines BL1 and BL2 is decreased. When the voltage level difference between the first and second bit lines BL1 and BL2 is decreased, the sense amplifier 40 cannot perform the sense amplification operation normally. Accordingly, the USD test time cannot be increased due to the leakage current of the transistor, and the reliability of the USD test cannot be improved.

SUMMARY OF THE INVENTION

Various aspects of the present invention comprise a semiconductor memory apparatus, capable of increasing a USD test time regardless of leakage current of a transistor, and a test method using the same.

In one aspect of the present invention, a semiconductor memory apparatus comprises: a precharge voltage control unit configured to selectively output a bit line precharge voltage or a core voltage as a control voltage in response to a test signal; a bit line equalization unit configured to precharge a bit line with the control voltage; a sense amplifier driving control unit configured to generate a first voltage supply control signal, a second voltage supply control signal and a third voltage supply control signal in response to the test signal, a sense amplifier enable test signal, a first voltage supply signal, a second voltage supply signal and a third voltage supply signal; and a voltage supply unit configured to provide the core voltage, an external voltage and a ground voltage to a sense amplifier with an open bit line structure in response to the first, second and third voltage supply control signals.

In another aspect of the present invention, a semiconductor memory apparatus comprises: a bit line precharge control unit configured to precharge a bit line to a core voltage when a test is performed, and precharge the bit line to a bit line precharge voltage when the test is not performed; and a voltage supply control unit configured to apply only the core voltage to a sense amplifier with an open bit line structure for a predetermined time and apply a ground voltage to the sense amplifier after the predetermined time elapses, when the test is performed.

In still another aspect of the present invention, a test method of a semiconductor memory apparatus comprises: storing data with a specific voltage in a memory cell; precharging a bit line to a core voltage; applying only the core voltage to a sense amplifier with an open bit line structure for a predetermined time; enabling a word line and transferring the voltage of the memory cell to the bit line; and applying both the core voltage and a ground voltage to the sense amplifier to read the voltage of the bit line after the predetermined time elapses.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION OF THE EMBODIMENTS

Figure 1:
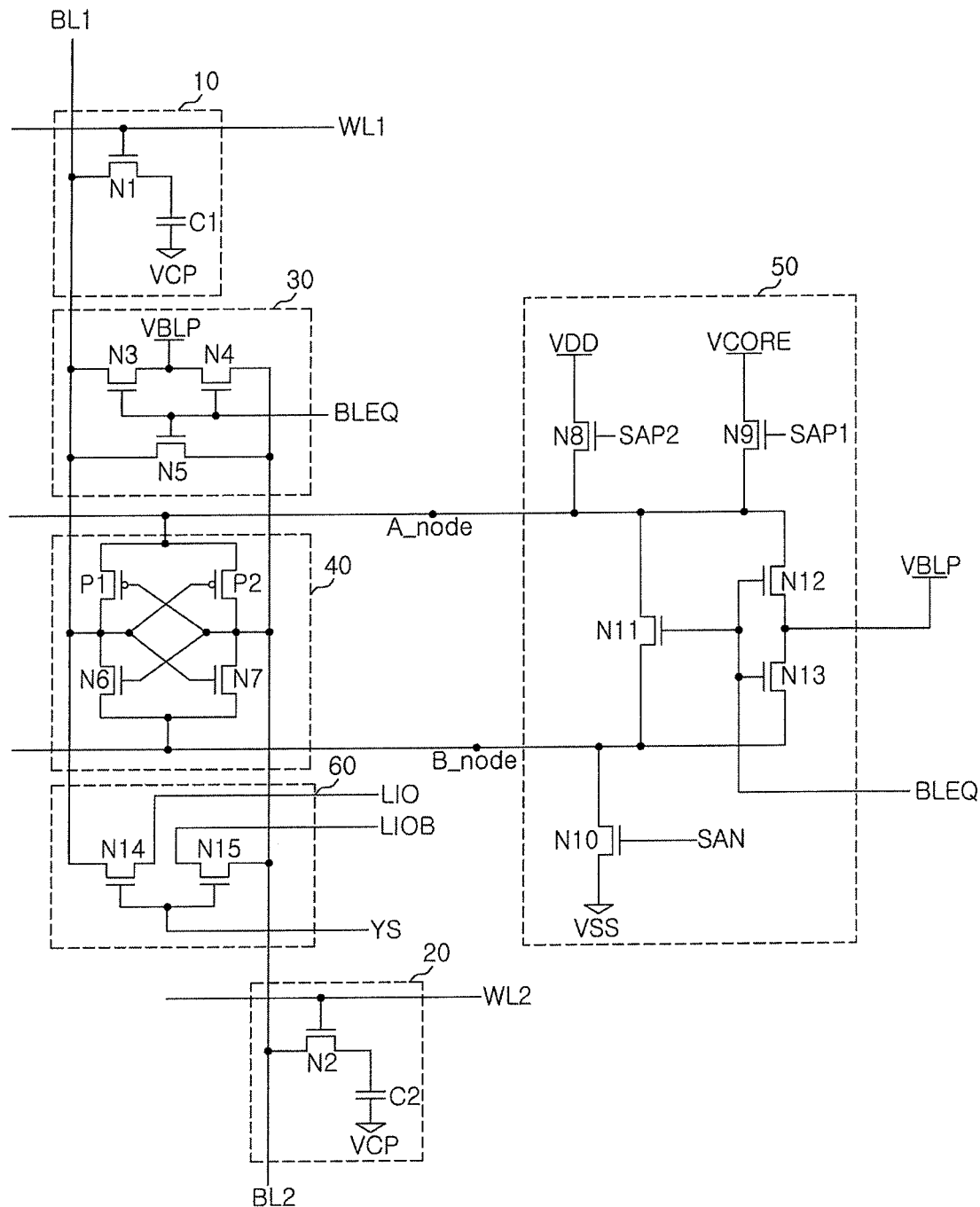
FIG. 1 is a diagram schematically showing a configuration of a typical semiconductor memory apparatus.

Advantages and characteristics of the present invention and a method for achieving them will be apparent with reference to embodiments described below with reference to the accompanying drawings. However, the present invention is not limited to the exemplary embodiments described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims. Throughout the specification, like elements refer to like reference numerals.

Figure 2:
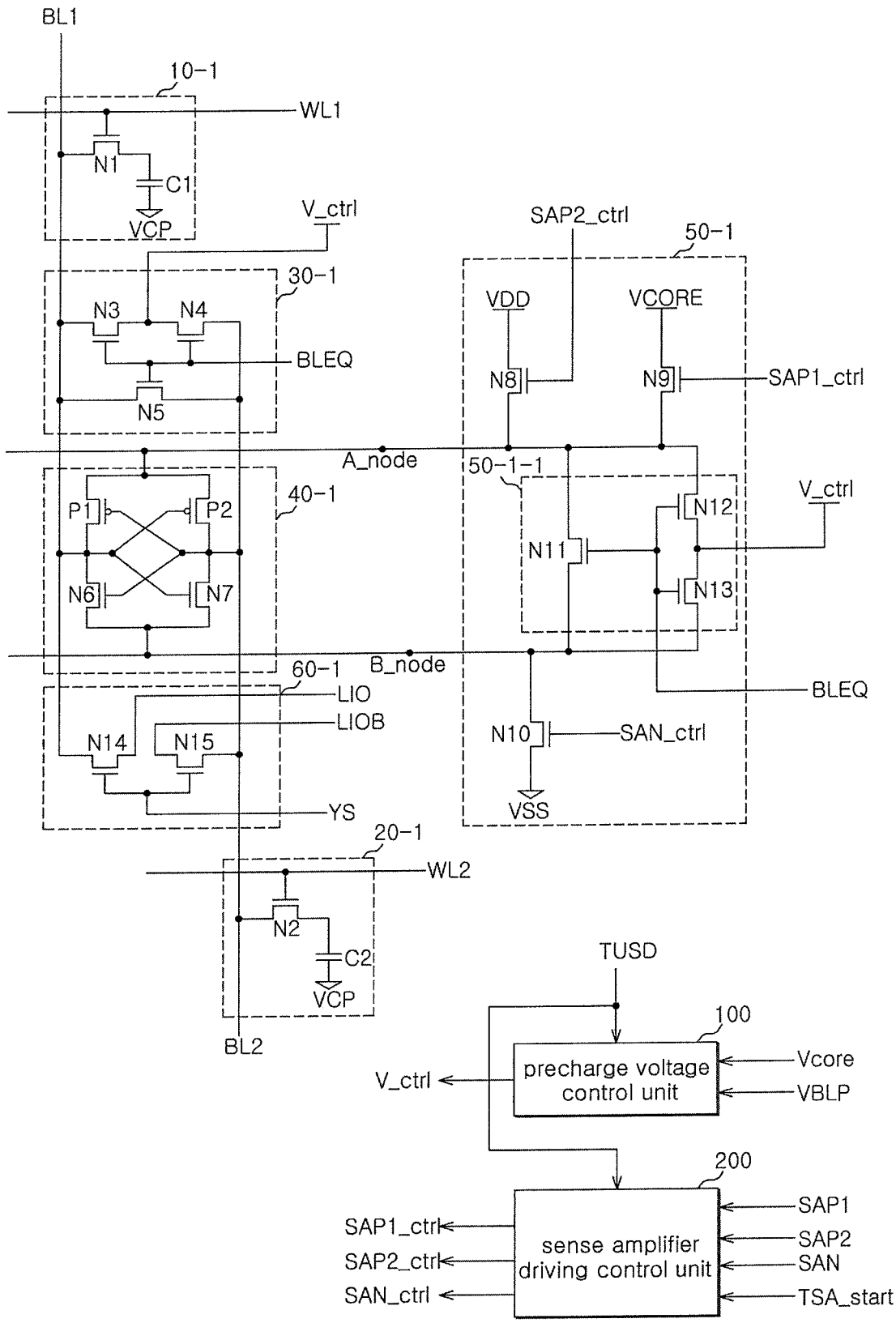
FIG. 2 is a diagram schematically showing a configuration of a semiconductor memory apparatus according to one embodiment of the invention.

FIG. 2 is a diagram schematically showing a configuration of a semiconductor memory apparatus with an open bit line structure according to one embodiment of the invention. As shown in FIG. 2, the semiconductor memory apparatus comprises a first memory cell 10-1, a second memory cell 20-1 a bit line equalization unit 30-1, a sense amplifier 40-1 a voltage supply unit 50-1, a data transfer unit 60-1, a precharge voltage control unit 100, and a sense amplifier driving control unit 200. Hereinafter, a bit line precharge voltage (VBLP) level corresponds to one half of a core voltage (Vcore) level, although other levels may also be used.

The first memory cell 10-1 comprises a first transistor N1 and a first capacitor C1. When a first word line WL1 is enabled, the semiconductor memory apparatus may store data in the first memory cell 10-1 by charging/discharging electric charges to/from the first capacitor C1 through a first bit line BL1.

Similarly, the second memory cell 20-1 comprises a second transistor N2 and a second capacitor C2. When a second word line WL2 is enabled, the semiconductor memory apparatus may store data in the second memory cell 20-1 by charging/discharging electric charges to/from the second capacitor C2 through a second bit line BL2.

The bit line equalization unit 30-1 comprises third to fifth transistors N3 to N5. The bit line equalization unit 30-1 precharges the first and second bit lines BL1 and BL2 to a control voltage (V_ctrl) level if a bit line equalization signal BLEQ is enabled.

The sense amplifier 40-1 comprises sixth to ninth transistors P1, P2, N6 and N7. The sense amplifier 40-1 receives a voltage from a first node A_node and a voltage from a second node B_node to sense and amplify a voltage level difference between the first and second bit lines BL1 and BL2.

The voltage supply unit 50-1 comprises tenth to fifteenth transistors N8 to N13. The voltage supply unit 50-1 applies the core voltage Vcore or an external voltage VDD to the first node A_node in response to first and second voltage supply control signals SAP1_ctrl and SAP2_ctrl, and applies a ground voltage VSS to the second node B_node in response to a third voltage supply control signal SAN_ctrl. When the first voltage supply control signal SAP1_ctrl is enabled, the voltage supply unit 50-1 turns on the eleventh transistor N9 to apply the core voltage Vcore to the first node A_node. When the second voltage supply control signal SAP2_ctrl is enabled, the voltage supply unit 50-1 turns on the tenth transistor N8 to apply the external voltage VDD to the first node A_node. When the third voltage supply control signal SAN_ctrl is enabled, the voltage supply unit 50-1 turns on the twelfth transistor N10 to apply the ground voltage VSS to the second node B_node. When a bit line equalization signal BLEQ is enabled, the voltage supply unit 50-1 precharges the first and second nodes A_node and B_node to the control voltage (V_ctrl) level. When the bit line equalization signal BLEQ is enabled, the thirteenth to fifteenth transistors N11 to N13 precharge the first and second nodes A_node and B_node to the control voltage (V_ctrl) level. For this reason, the thirteenth to fifteenth transistors N11 to N13 may be referred to as a node precharge unit 50-1-1.

The data transfer unit 60-1 comprises sixteenth and seventeenth transistors N14 and N15. The data transfer unit 60-1 transfers data of the first and second bit lines BL1 and BL2 to first and second data transfer lines LIO and LIOB if a column selection signal YS is enabled.

The precharge voltage control unit 100 selectively outputs a bit line precharge voltage VBLP or the core voltage Vcore as the control voltage V_ctrl in response to a test signal TUSD.

The sense amplifier driving control unit 200 generates first to third voltage supply control signals SAP1_ctrl, SAP2_ctrl and SAN_ctrl in response to the test signal TUSD, a sense amplifier enable test signal TSA_start, and first to third voltage supply signals SAP1, SAP2 and SAN.

Figure 3:
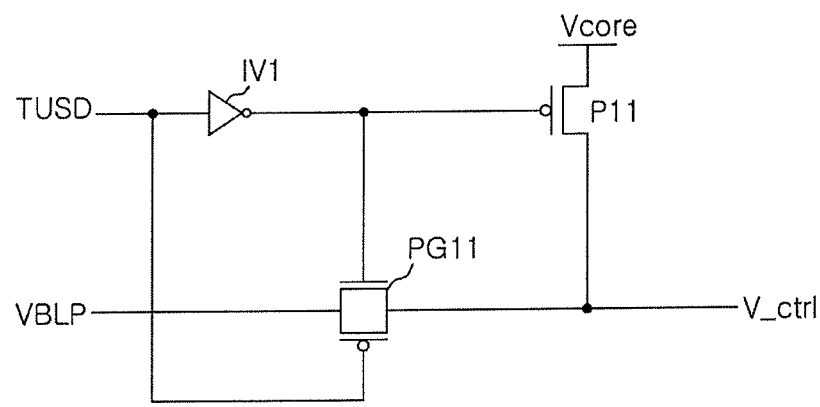
FIG. 3 is a diagram showing a configuration of a precharge voltage control unit of FIG. 2 according to one embodiment of the invention.

FIG. 3 is a diagram showing a configuration of an embodiment of the precharge voltage control unit 100 shown in FIG. 2.

Referring to FIG. 3, the precharge voltage control unit 100 outputs the core voltage Vcore as the control voltage V_ctrl if the test signal TUSD is enabled to a logic high level, and outputs the bit line precharge voltage VBLP as the control voltage V_ctrl if the test signal TUSD is disabled to a logic low level.

As shown in FIG. 3, the precharge voltage control unit 100 comprises a first inverter IV1, a pass gate PG11 and an eighteenth transistor P11. The first inverter IV1 receives the test signal TUSD. The pass gate PG11 has a first control terminal configured to receive an output signal of the first inverter IV1, a second control terminal configured to receive the test signal TUSD, and an input terminal configured to receive the bit line precharge voltage VBLP. The eighteenth transistor P11 has a gate terminal configured to receive the output signal of the first inverter IV1, and a source terminal configured to receive the core voltage Vcore. The control voltage V_ctrl is outputted from a node commonly coupled to a drain terminal of the eighteenth transistor P11 and an output terminal of the pass gate PG11.

Figure 4:
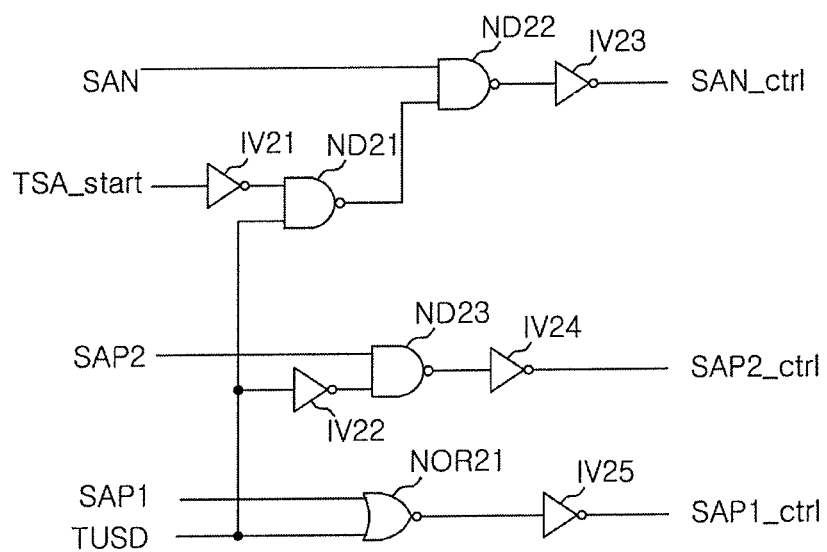
FIG. 4 is a diagram showing a configuration of a sense amplifier driving control unit in FIG. 2 according to one embodiment of the invention.

FIG. 4 is a diagram showing a configuration of an embodiment of the sense amplifier driving control unit 200 shown in FIG. 2.

Referring to FIG. 4, when the test signal TUSD is enabled to a logic high level, the sense amplifier driving control unit 200 enables the first voltage supply control signal SAP1_ctrl to a logic high level and disables the second voltage supply control signal SAP2_ctrl to a logic low level. In addition, when the sense amplifier enable test signal TSA_start is enabled to a logic high level in a state where the test signal TUSD has been enabled at a logic high level and the third voltage supply signal SAN has been enabled at a logic high level, the sense amplifier driving control unit 200 enables the third voltage supply control signal SAN_ctrl to a logic high level. On the other hand, when the test signal TUSD is disabled to a logic low level, the sense amplifier driving control unit 200 outputs the first voltage supply signal SAP1 as the first voltage supply control signal SAP1_ctrl, and outputs the second voltage supply signal SAP2 as the second voltage supply control signal SAP2_ctrl, and outputs the third voltage supply signal SAN as the third voltage supply control signal SAN_ctrl.

As shown in FIG. 4, the sense amplifier driving control unit 200 comprises second to sixth inverters IV21 to IV25, first to third NAND gates ND21 to ND23, and a NOR gate NOR21. The second inverter IV21 receives the sense amplifier enable test signal TSA_start. The first NAND gate ND21 receives the test signal TUSD and an output signal of the second inverter IV21. The third inverter IV22 receives the test signal TUSD. The NOR gate NOR21 receives the test signal TUSD and the first voltage supply signal SAP1. The second NAND gate ND22 receives the third voltage supply signal SAN and an output signal of the first NAND gate ND21. The third NAND gate ND23 receives the second voltage supply signal SAP2 and an output signal of the third inverter IV22. The fourth inverter IV23 receives an output signal of the second NAND gate ND22 to output the third voltage supply control signal SAN_ctrl. The fifth inverter IV24 receives an output signal of the third NAND gate ND23 to output the second voltage supply control signal SAP2_ctrl. The sixth inverter IV25 receives an output signal of the NOR gate NOR21 to output the first voltage supply control signal SAP1_ctrl.

In such a configuration, the semiconductor memory apparatus according to the embodiment may operate as follows.

Referring back to FIG. 2, when the test signal TUSD is enabled, the precharge voltage control unit 100 outputs the core voltage Vcore instead of the bit line precharge voltage VBLP. Therefore, after the test signal TUSD is enabled, if the bit line equalization signal BLEQ is enabled, the bit line equalization unit 30-1 precharges the first and second bit lines BL1 and BL2 to the core voltage (Vcore) level. Therefore, a circuit unit including the precharge voltage control unit 100 and the bit line equalization unit 30-1 may be referred to as a bit line precharge control unit. In addition, when the bit line equalization signal BLEQ is enabled, the first and second nodes A_node and B_node are also precharged to the core voltage (Vcore) level by the node precharge unit 50-1-1.

When the test signal TUSD is enabled, the sense amplifier driving control unit 200 enables the first voltage supply control signal SAP1_ctrl. When the first voltage supply control signal SAP1_ctrl is enabled, the voltage supply unit 50-1 applies the core voltage Vcore to the first node A_node and therefore provides the core voltage Vcore to the sense amplifier 40-1. In addition, when the sense amplifier enable test signal TSA_start is enabled in the state where the test signal TUSD is enabled and the third voltage supply signal SAN is enabled, the sense amplifier driving control unit 200 enables the third voltage supply control signal SAN_ctrl. When the third voltage supply control signal SAN_ctrl is enabled, the voltage supply unit 50-1 applies the ground voltage VSS to the second node B_node and therefore provides the ground voltage VSS to the sense amplifier 40-1. Therefore, a circuit unit including the sense amplifier driving control unit 200 and the voltage supply unit 50-1 may be referred to as a voltage supply control unit. When the ground voltage VSS is provided to the sense amplifier 40-1 in a state where the core voltage Vcore is applied to the sense amplifier 40-1, the sense amplifier 40-1 is enabled, and thus senses and amplifies the voltage level difference between the first and second bit lines BL1 and BL2.

According to one embodiment of the invention, the core voltage Vcore is provided to the sense amplifier 40-1 during the USD test, whereas no voltage is provided to the sense amplifier 40 during the USD test according to the typical semiconductor memory apparatus shown in FIG. 1. Referring to FIGS. 2 and 4, since the core voltage Vcore is provided to the first node A_node during the USD test, the core voltage Vcore compensates for a voltage drop caused by leakage current of the eighth and ninth transistors N6 and N7. That is, leakage current of the sixth and seventh transistors P1 and P2 receiving the core voltage Vcore compensates the voltage drop of the first and second bit lines BL1 and BL2 caused by the leakage current of the eighth and ninth transistors N6 and N7. Therefore, the voltage level difference between the first and second bit lines BL1 and BL2 may be substantially maintained, therefore the semiconductor memory apparatus according to the embodiment of the invention can increase the USD test time unlike typical semiconductor memory apparatus. That is, after the word line is enabled, the semiconductor memory apparatus according to the embodiment of the invention can have a longer enable time of the sense amplifier than that in a typical semiconductor memory apparatus, therefore improving the reliability of the USD test.

The USD test may be performed on the semiconductor memory apparatus according to the embodiment of the invention as follows and with reference to FIG. 2.

First, a logic low data may be stored in the first memory cell 10-1. When the test signal TUSD is enabled, the core voltage Vcore is provided as the control voltage V_ctrl, and subsequently is provided to the sense amplifier 40-1 via the first node A_node. When the bit line equalization signal BLEQ is enabled, the first and second bit lines BL1 and BL2 and the first and second nodes A_node and B_node are all precharged to the core voltage (Vcore) level.

When the first word line WL1 is enabled, the voltage level difference between the first and second bit lines BL1 and BL2 is generated. The sense amplifier enable test signal TSA_start is enabled when a predetermined time required for the USD test elapses after the first word line WL1 is enabled. When the sense amplifier enable test signal TSA_start is enabled, the sense amplifier 40-1 is provided with the ground voltage VSS, and subsequently is enabled. The enabled sense amplifier 40-1 senses and amplifies the voltage level difference between the first and second bit lines BL1 and BL2.

When the column selection signal YS is enabled, the voltage level difference between the first and second bit lines BL1 and BL2 is transferred to the first and second data transfer lines LIO and LIOB. Consequently, the data stored in the first memory cell 10-1 is outputted through the first and second data transfer lines LIO and LIOB electrically connected to the first and second bit lines BL1 and BL2.

When the data outputted from the first memory cell 10-1 is at a logic low level, this test result indicates that no micro-bridge exists between the first word line WL1 and the first bit line BL1, whereas, when the data outputted from the first memory cell 10-1 is at a logic high level, this test result indicates that the micro-bridge does exist between the first word line WL1 and the first bit line BL1.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A semiconductor memory apparatus comprising:
a precharge voltage control unit configured to selectively output one of a bit line precharge voltage and a core voltage as a control voltage in response to a test signal;
a bit line equalization unit configured to precharge a bit line with the control voltage;
a sense amplifier driving control unit configured to generate a first voltage supply control signal, a second voltage supply control signal and a third voltage supply control signal in response to the test signal, a sense amplifier enable test signal, a first voltage supply signal, a second voltage supply signal and a third voltage supply signal; and
a voltage supply unit configured to provide the core voltage, an external voltage and a ground voltage to a sense amplifier in response to the first, second and third voltage supply control signals.

2. The semiconductor memory apparatus of claim 1, wherein the precharge voltage control unit is configured to output the core voltage as the control voltage if the test signal is enabled, and output the bit line precharge voltage as the control voltage if the test signal is disabled.

3. The semiconductor memory apparatus of claim 1, wherein the bit line equalization unit is configured to precharge the bit line to the control voltage if a bit line equalization signal is enabled.

4. The semiconductor memory apparatus of claim 1, wherein the sense amplifier driving control unit is configured to enable the first voltage supply control signal if the test signal is enabled, and enable the third voltage supply control signal if the sense amplifier enable test signal is enabled, and the sense amplifier driving control unit is configured to output the first voltage supply signal as the first voltage supply control signal, the second voltage supply signal as the second voltage supply control signal, and the third voltage supply signal as the third voltage supply control signal, if the test signal is disabled.

5. The semiconductor memory apparatus of claim 1, wherein the voltage supply unit is configured to provide the core voltage to the sense amplifier if the first voltage supply control signal is enabled, and provide the external voltage to the sense amplifier if the second voltage supply control signal is enabled, and provide the ground voltage to the sense amplifier if the third voltage supply control signal is enabled.

6. The semiconductor memory apparatus of claim 3, wherein the voltage supply unit further comprises a node precharge unit configured to precharge a first node and a second node with the control voltage if a bit line equalization signal is enabled, wherein the first node is configured to provide the external voltage or the core voltage to the sense amplifier and the second node is configured to provide the ground voltage to the sense amplifier.

7. A semiconductor memory apparatus comprising:
a bit line precharge control unit configured to precharge a bit line to a core voltage when a test signal is enabled, and precharge the bit line to a bit line precharge voltage when the test signal is disabled; and
a voltage supply control unit configured to apply the core voltage to a sense amplifier with an open bit line structure when the test signal is enabled and apply a ground voltage to the sense amplifier when a sense amplifier enable test signal is enabled,
wherein the bit line precharge control unit and the voltage supply control unit precharge the bit line to the core voltage and simultaneously apply the core voltage to the sense amplifier.

8. The semiconductor memory apparatus of claim 7, wherein the bit line precharge control unit comprises:
a precharge voltage control unit configured to selectively output the bit line precharge voltage or the core voltage as a control voltage in response to the test signal; and
a bit line equalization unit configured to precharge the bit line with the control voltage.

9. The semiconductor memory apparatus of claim 8, wherein the precharge voltage control unit is configured to output the core voltage as the control voltage if the test signal is enabled, and output the bit line precharge voltage as the control voltage if the test signal is disabled.

10. The semiconductor memory apparatus of claim 8, wherein the bit line equalization unit is configured to precharge the bit line to the control voltage if a bit line equalization signal is enabled.

11. The semiconductor memory apparatus of claim 7, wherein the voltage supply control unit is configured to apply the core voltage to the sense amplifier if the test signal is enabled, and apply the ground voltage to the sense amplifier if the sense amplifier enable test signal is enabled in a state where the test signal is enabled.

12. The semiconductor memory apparatus of claim 7, wherein the voltage supply control unit is configured to provide the core voltage, an external voltage and the ground voltage to the sense amplifier in response to a first voltage supply signal, a second voltage supply signal and a third voltage supply signal.

13. The semiconductor memory apparatus of claim 12, wherein the voltage supply control unit comprises:
a sense amplifier driving control unit configured to generate a first voltage supply control signal, a second voltage supply control signal and a third voltage supply control signal in response to the first, second and third voltage supply signals, the test signal and the sense amplifier enable test signal; and a voltage supply unit configured to provide the core voltage, the external voltage and the ground voltage to the sense amplifier in response to the first, second and third voltage supply control signals.

14. The semiconductor memory apparatus of claim 13, wherein the sense amplifier driving control unit is configured to enable the first voltage supply control signal if the test signal is enabled, and enable the third voltage supply control signal if the sense amplifier enable test signal is enabled, and the sense amplifier driving control unit is configured to output the first voltage supply signal as the first voltage supply control signal, the second voltage supply signal as the second voltage supply control signal, and the third voltage supply signal as the third voltage supply control signal, if the test signal is disabled.

15. The semiconductor memory apparatus of claim 13, wherein the voltage supply unit is configured to provide the core voltage to the sense amplifier if the first voltage supply control signal is enabled, and provide the external voltage to the sense amplifier if the second voltage supply control signal is enabled, and provide the ground voltage to the sense amplifier if the third voltage supply control signal is enabled.

16. The semiconductor memory apparatus of claim 10, wherein the voltage supply unit is configured to precharge a first node and a second node to the core voltage if the test signal is enabled and the bit line equalization signal is enabled, wherein the first node is configured to provide an external voltage or the core voltage to the sense amplifier and the second node is configured to provide the ground voltage to the sense amplifier, and the voltage supply unit is configured to precharge the first node and the second node to a bit line precharge voltage level if the test signal is disabled and the bit line equalization signal is enabled.

17. A test method of a semiconductor memory apparatus comprising:

storing data with a predetermined voltage in a memory cell;
precharging a bit line to a core voltage and
simultaneously applying the core voltage to a sense amplifier with an open bit line structure when a test signal is enabled;
enabling a word line and transferring the predetermined voltage of the memory cell to the bit line; and
applying both the core voltage and a ground voltage to the sense amplifier to read a voltage of the bit line when a sense amplifier enable signal is enabled in a state where the test signal is enabled.

18. The test method of claim 17, further comprising precharging the bit line and a plurality of nodes to the core voltage, wherein the plurality of nodes are respectively configured to provide the core voltage and the ground voltage to the sense amplifier.

* * * * *